United States Patent [19]

Ueda et al.

[11] Patent Number: 5,105,261
[45] Date of Patent: Apr. 14, 1992

[54] SEMICONDUCTOR DEVICE PACKAGE HAVING PARTICULAR LEAD STRUCTURE FOR MOUNTING MULTIPLE CIRCUIT BOARDS

[75] Inventors: Tetsuya Ueda; Toru Tachikawa; Masataka Takehara, all of Itami, Japan

[73] Assignee: Mitsubishi Denki Kabushiki Kaisha, Tokyo, Japan

[21] Appl. No.: 758,719

[22] Filed: Sep. 9, 1991

Related U.S. Application Data

[63] Continuation of Ser. No. 446,140, Dec. 5, 1989, abandoned.

[30] Foreign Application Priority Data

Mar. 30, 1989 [JP] Japan .................. 1-80485

[51] Int. Cl.⁵ .............................. H01L 23/48
[52] U.S. Cl. .......................... 357/74; 357/70
[58] Field of Search ............... 357/70, 74, 80; 174/52.4

[56] References Cited

U.S. PATENT DOCUMENTS 5,025,307  6/1991  Ueda et al. ................ 357/74

FOREIGN PATENT DOCUMENTS

59-15500  12/1979  Japan .
55-107251  8/1980  Japan ........................ 357/70
59-63751   4/1984  Japan ........................ 357/70
60-103652  6/1985  Japan ........................ 357/70
63-52455   3/1988  Japan ........................ 357/70

Primary Examiner—Rolf Hille
Assistant Examiner—S. V. Clark
Attorney, Agent, or Firm—Oblon, Spivak, McClelland, Maier & Neustadt

[57] ABSTRACT

The semiconductor device has leads projecting from at least two sides of all of a package which are bent in a zigzag manner so that ends of the leads lie on at least two planes. The semiconductor device may be mounted across a plurality of printed circuit boards by fixing a part of the leads from one side to a first board and fixing a remaining part of the leads from the other side to a second board, or by fixing a part of the leads on one plane to a first board and fixing a remaining part of the leads on the other plane to a second board.

14 Claims, 11 Drawing Sheets

SEMICONDUCTOR DEVICE PACKAGE HAVING PARTICULAR LEAD STRUCTURE FOR MOUNTING MULTIPLE CIRCUIT BOARDS

This application is a continuation of application Ser. No. 07/446,140, filed on Dec. 5, 1989, now abandoned.

BACKGROUND OF THE INVENTION

1. Field of the Invention

The present invention relates to a semiconductor device and a method of mounting the same and, more particularly, to the configuration of a lead of a semiconductor device and a method of mounting the semiconductor device having the lead of such a configuration.

2. Description of the Background Art

Figure 1:
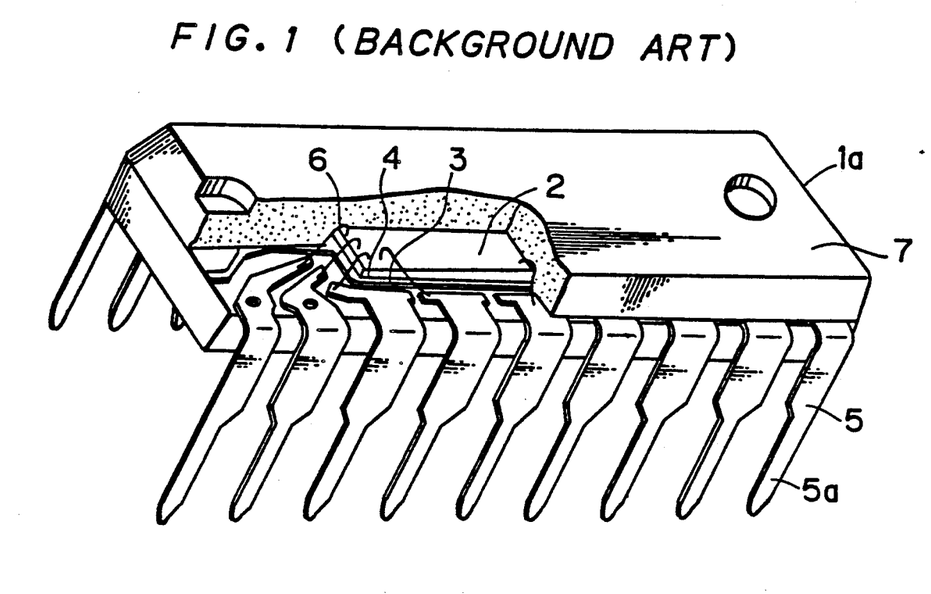
FIG. 1 is a partially cutaway perspective view showing a conventional DIL type semiconductor device.

FIG. 1 is a partially cutaway perspective view showing a conventional DIL (Dual In Line Package) type semiconductor device which has leads arranged in parallel and extending downward from opposite sides of a package. Referring to FIG. 1, this DIL type semiconductor device 1a comprises a semiconductor element 2 fixed on a die pad 3 for supporting the semiconductor element 2 by means of solder material 4. The semiconductor element 2 has electrodes (not shown) which are connected with leads 5 through thin metal wires 6. Portions of the leads 5 to be connected with the wires 6 are provided with plating such as Ag plating in order to ensure the connection. The semiconductor element 2 and the wires 6 are sealed with mold resin 7 which forms a plastic package for protection against external forces. After the completion of the package 7, the leads 5 are cut away from a lead frame (not shown) and ends 5a of the leads 5 projecting from the package 7 are bent perpendicularly to the package 7.

Figure 2A:
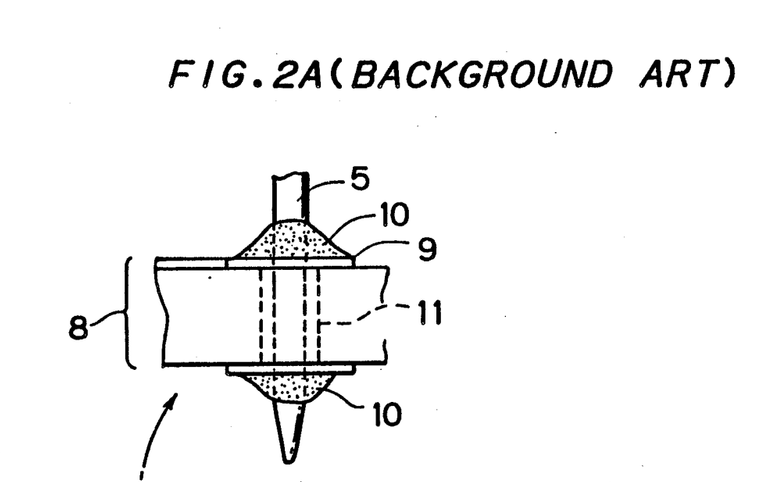
FIG. 2A to FIG. 2C are views showing the DIL type semiconductor device mounted on a printed circuit board.
Figure 2B:
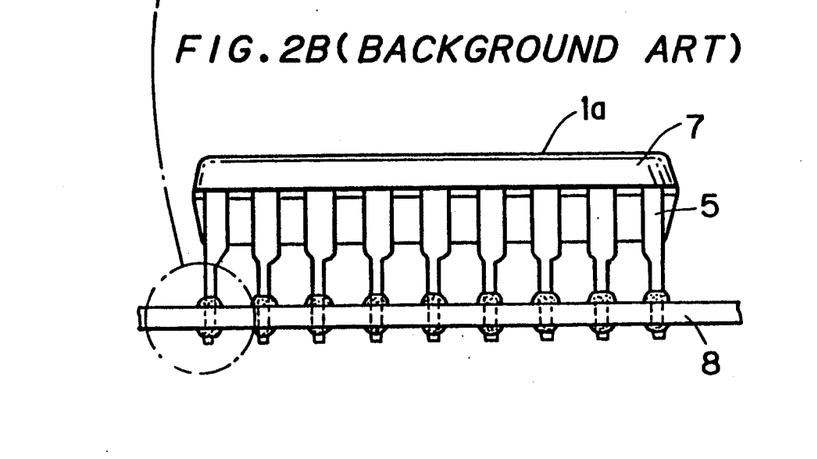
Figure 2C:
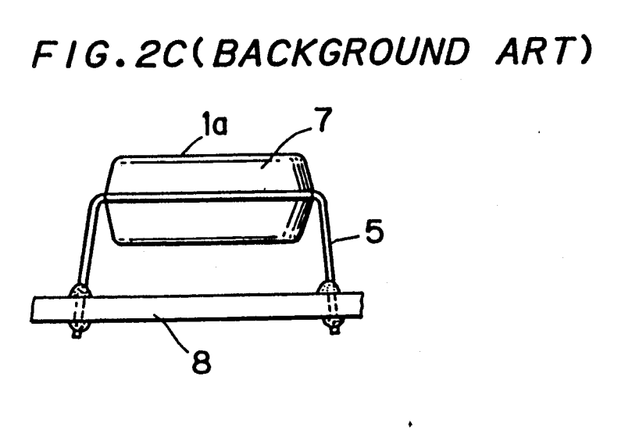

FIG. 2B is a front view showing the DIL type semiconductor device 1a mounted on a printed circuit board 8. FIG. 2C is a side view of FIG. 2B and FIG. 2A is a fragmentary enlarged view of FIG. 2B. The leads 5 are inserted into through holes 11 of the board 8 from the upper side of the board 8, and then solder 10 is supplied in the through holes 11 from the lower side of the board 8 to connect the leads 5 with leads 9. Thus the semiconductor device 1a is mounted on the board 8. The leads 9 are connected with other devices and the like (not shown) mounted on the board 8 through a wiring pattern (not shown) formed on the board 8.

Figure 3:
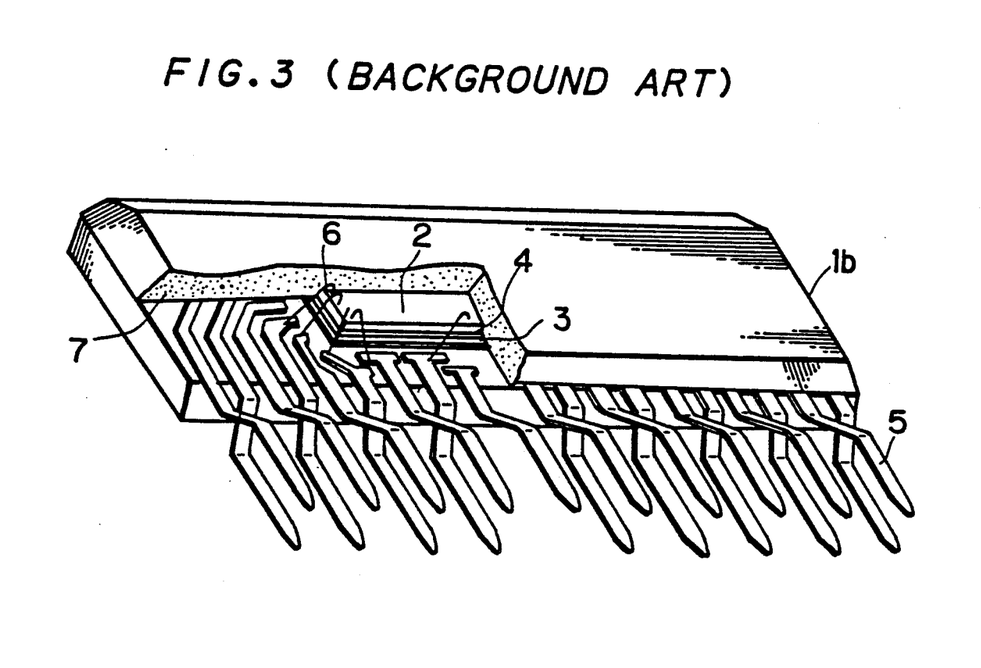
FIG. 3 is a partially cutaway perspective view showing a conventional ZIL type semiconductor device.
Figure 4A:
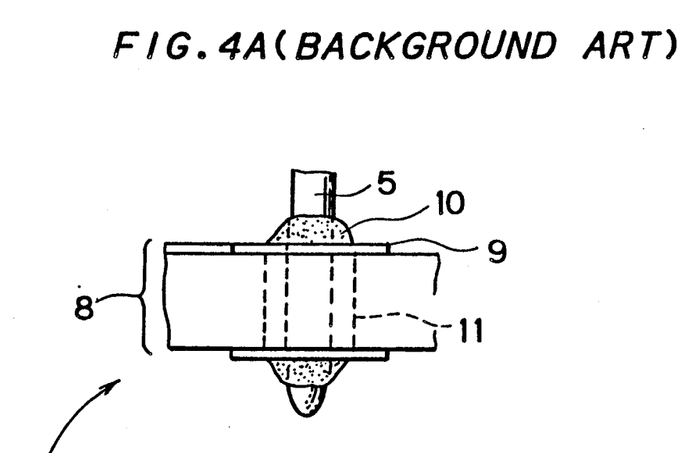
FIG. 4A to FIG. 4C are views showing the ZIL type semiconductor device mounted on a printed circuit board.
Figure 4B:
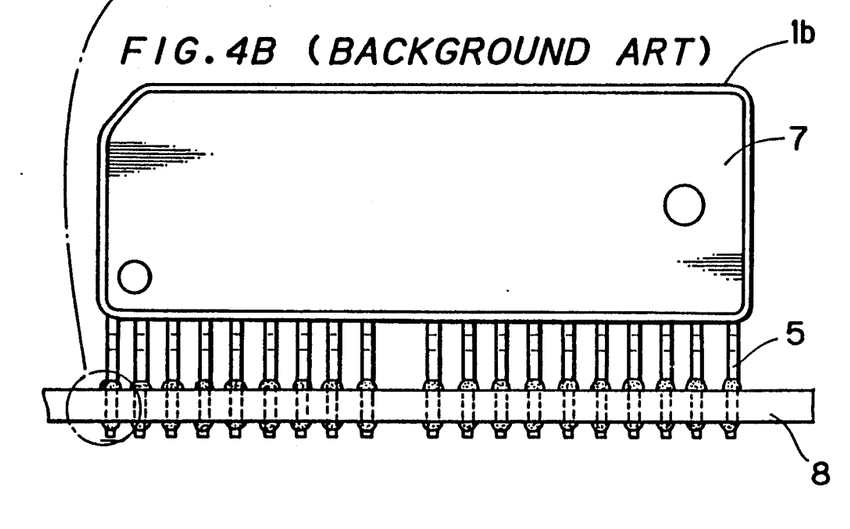
Figure 4C:
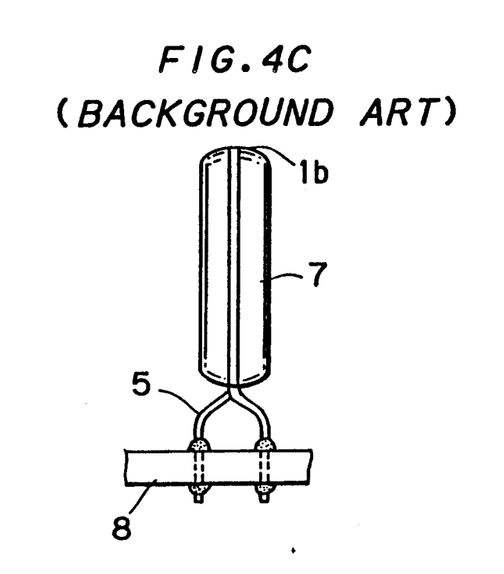

FIG. 3 is a partially cutaway perspective view showing a conventional ZIL (Zigzag In Line Package) type semiconductor device which has leads extending from one side of a package which are bent alternately on two planes in a zigzag manner. This ZIL type semiconductor device 1b is mounted on a printed circuit board 8 as shown in FIG. 4, wherein FIG. 4B is a front view, FIG. 4C is a side view of FIG. 4B and FIG. 4A is a fragmentary enlarged view of FIG. 4B. Reference numerals 2 to 11 in FIG. 3 and FIG. 4 denote the same components as in FIG. 1 and FIG. 2.

The DIL type semiconductor device shown in FIG. 1 and the ZIL type semiconductor device shown in FIG. 3 are called through hole devices because these devices are mounted on the board 8 by inserting the leads 5 into the through holes 11.

Figure 5:
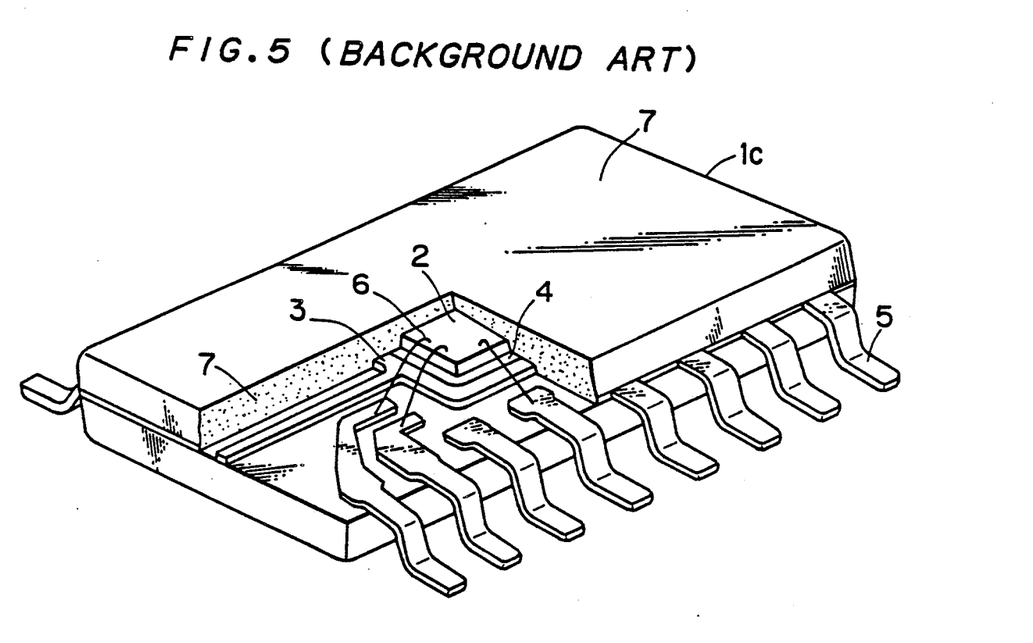
FIG. 5 is a partially cutaway perspective view showing a conventional SOP type semiconductor device.
Figure 6A:
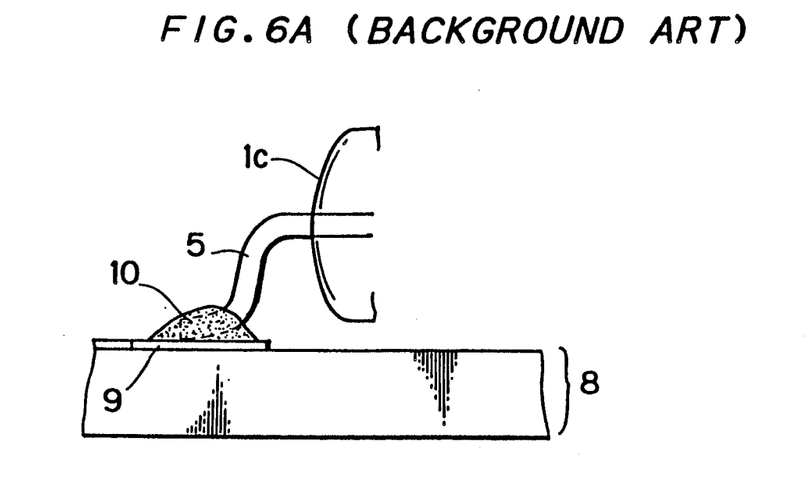
FIG. 6A to FIG. 6C are views showing the SOP type semiconductor device mounted on a printed circuit board.
Figure 6B:
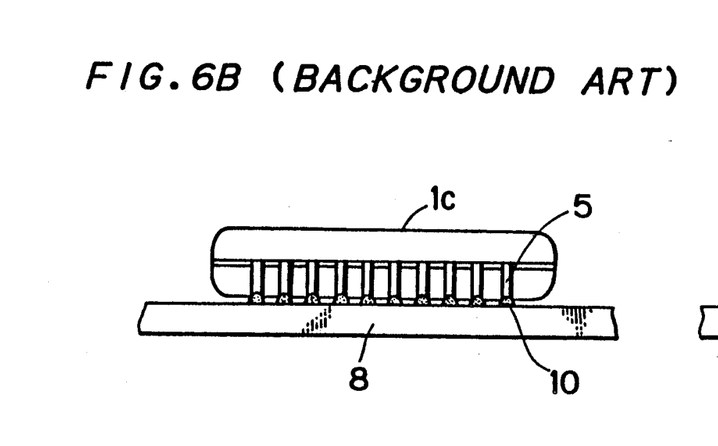
Figure 6C:
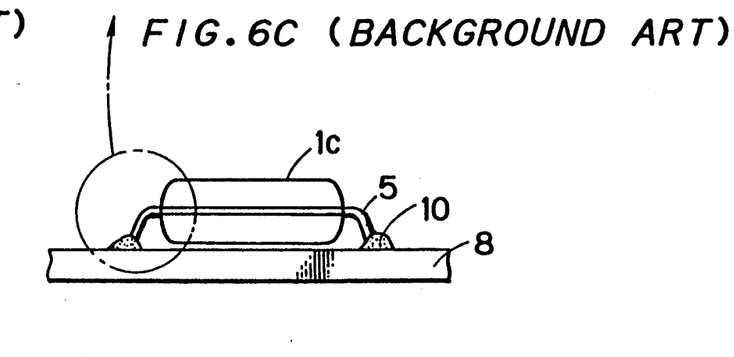

FIG. 5 is a partially cutaway perspective view showing a conventional SOP (Small Outline Package) type semiconductor device which has steplike leads arranged in parallel which are extending from opposite sides of a package. This SOP type semiconductor device 1c is mounted on a printed circuit board 8 as shown in FIG. 6, wherein FIG. 6B is a front view, FIG. 6C is a side view of FIG. 6B and FIG. 6A is a fragmentary enlarged view of FIG. 6C. Reference numerals 2 to 10 in FIG. 5 and FIG. 6 denote the same components as in FIG. 1 to FIG. 4.

The SOP type semiconductor device shown in FIG. 5 is called a surface mounting type device (SMD) because this device is mounted on the board 8 without through holes.

Disadvantageously, the conventional semiconductor devices structured as hereinbefore described can not be mounted across a plurality of printed circuit boards not lying on the same plane.

SUMMARY OF THE INVENTION

A semiconductor device in accordance with the present invention comprises a semiconductor element, a package for sealing the semiconductor element and leads electrically connected with the semiconductor element, the leads projecting from at least two (first and second) sides of the package and being bent in a zigzag manner so that the ends of the leads lie on at least two (first and second) planes.

This semiconductor device may be mounted across a plurality of printed circuit boards in accordance with a method of mounting a semiconductor device according to the present invention, comprising the steps of preparing first and second printed circuit boards, fixing a first group of the leads projecting from the first side of the package to the first printed circuit board, and fixing a second group of the leads projecting from the second side of the package to the second printed circuit board.

This semiconductor device may also be mounted across a plurality of printed circuit boards in accordance with a method of mounting a semiconductor device according to the present invention, comprising the steps of preparing first and second printed circuit boards, fixing a first group of the leads lying on the first plane to the first printed circuit board, and fixing a second group of the leads lying on the second plane to the second printed circuit board.

Accordingly, it is an object of the present invention to provide a semiconductor device and a method of mounting the same wherein the semiconductor device can be mounted across a plurality of printed circuit boards not lying on the same plane.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 7:
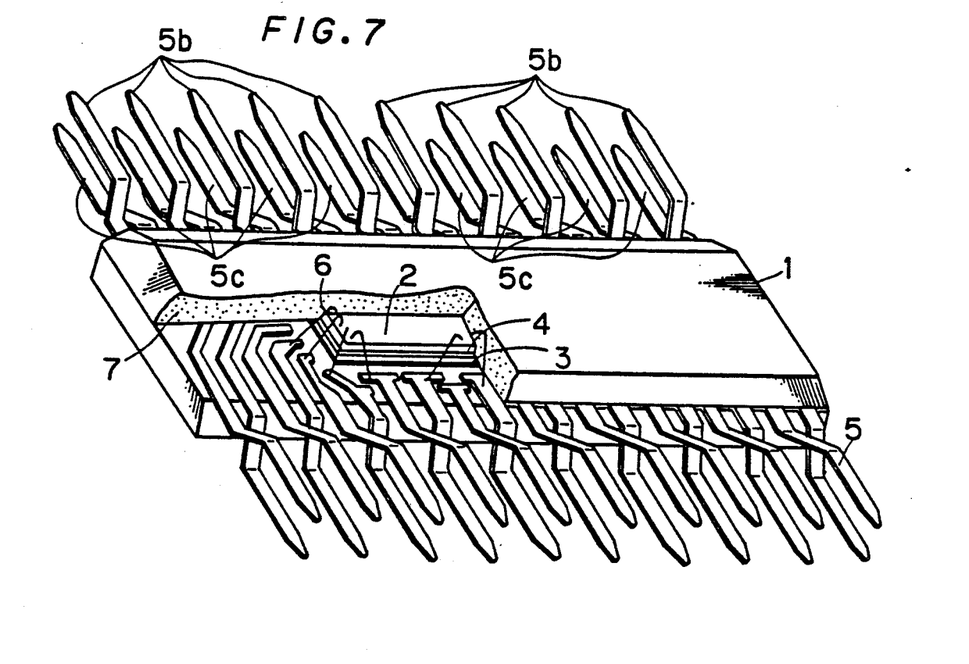
FIG. 7 is a partially cutaway perspective view showing a first embodiment of a semiconductor device in accordance with the present invention.

FIG. 7 is a partially cutaway perspective view showing an embodiment of a semiconductor device in accordance with the present invention. Referring to FIG. 7, this semiconductor device 1 comprises a semiconductor element 2 fixed on a die pad 3 for supporting the semiconductor element 2 by means of solder material 4. The semiconductor element 2 has electrodes (not shown) which are connected with leads 5 through thin metal wires 6. Portions of the leads 5 to be connected with the wires 6 are provided with a plating such as an Ag plating in order to ensure the connection. The semiconductor element 2 and the wires 6 are sealed with mold resin 7 which forms a plastic package for protection against external forces. After the completion of the package 7, the leads 5 are cut away from a lead frame (not shown). At this stage, the semiconductor device 1 has a structure shown in FIG. 8.

Figure 8:
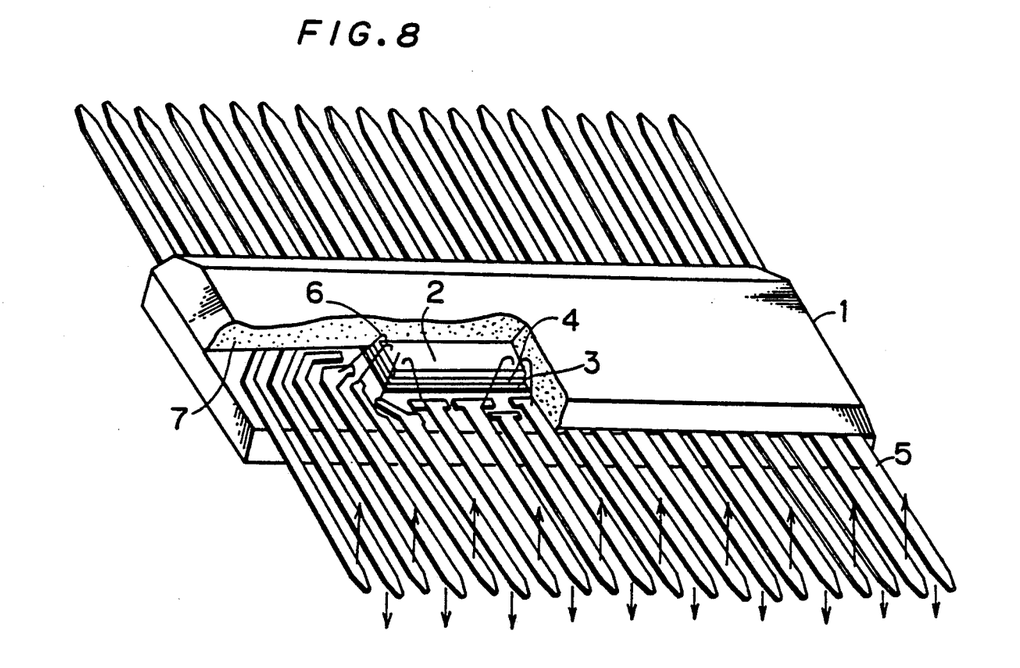
FIG. 8 is a partially cutaway perspective view showing the semiconductor device of the first embodiment before the completion thereof.
Figure 9A:
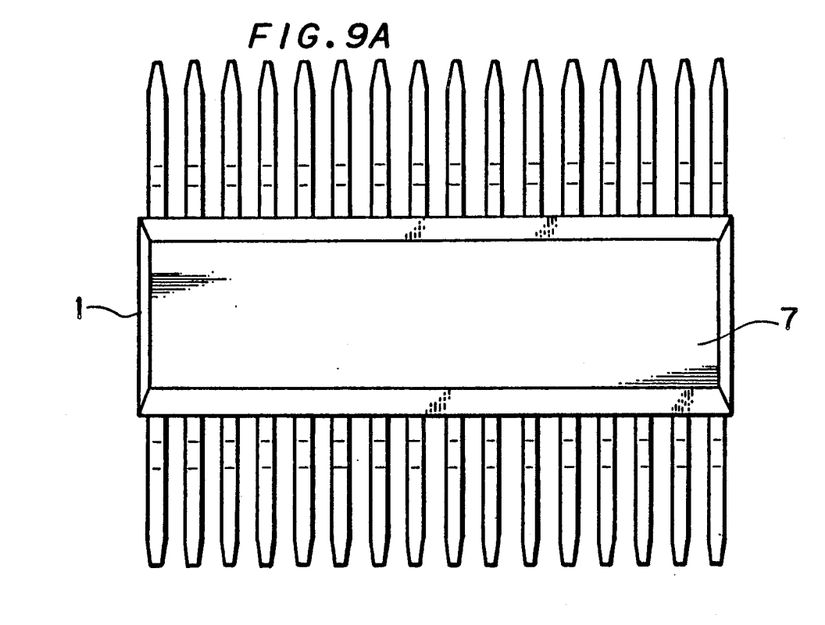
FIG. 9A to FIG. 9C are plane, side and front views, respectively, showing the semiconductor device of the first embodiment.
Figure 9B:
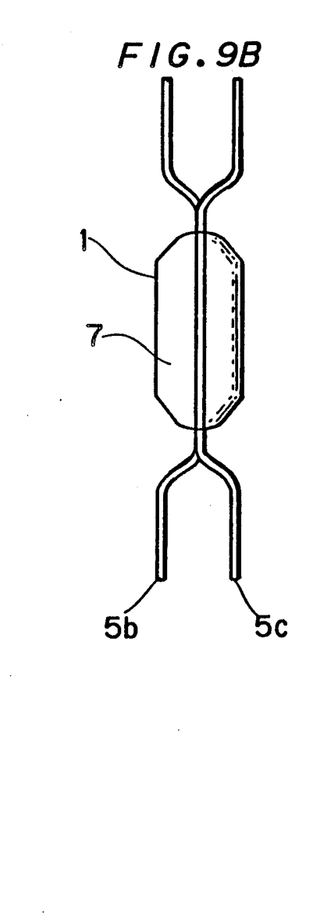
Figure 9C:
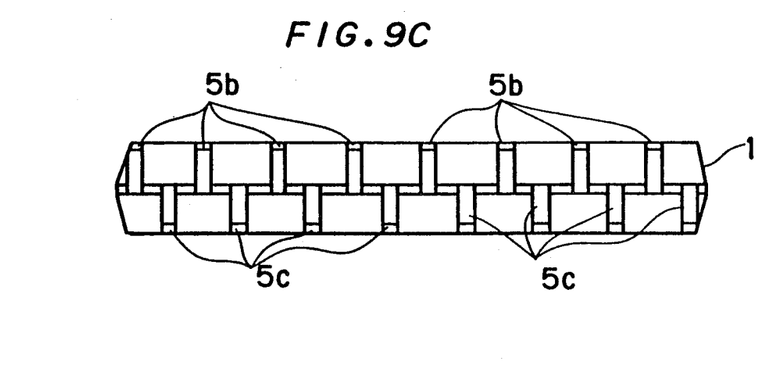

After that, the leads 5 are alternately bent upward and downward as shown by arrows in FIG. 8. Thus, there is completed the semiconductor device 1, wherein the leads 5 are projected from opposite sides of the package 7 and are alternately bent upward and downward in a zigzag manner. FIG. 9A is a plane view of the completed semiconductor device 1 and FIG. 9B and FIG. 9C are side and front views of FIG. 9A, respectively. Ends of leads 5b of the leads 5 lie on a first plane in the top surface side of the semiconductor device 1 and ends of leads 5c of the leads 5 lie on a second plane in the rear surface side of the semiconductor device 1.

Figure 10A:
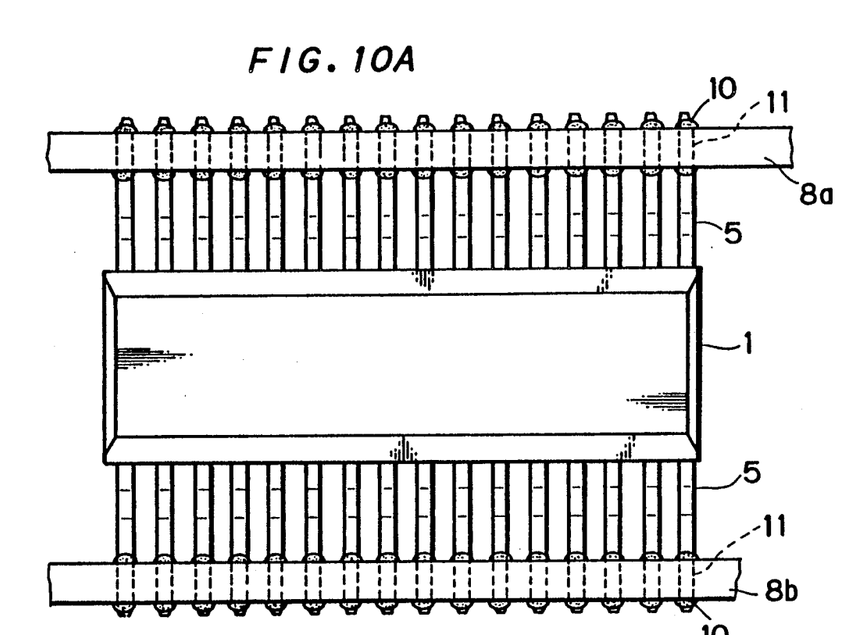
FIG. 10A to FIG. 10C and FIG. 11A to FIG. 11C are views showing the semiconductor device of the first embodiment mounted across two printed circuit boards.
Figure 10B:
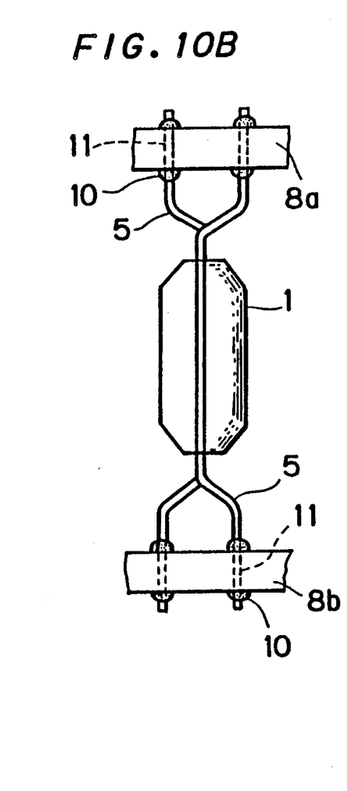
Figure 10C:
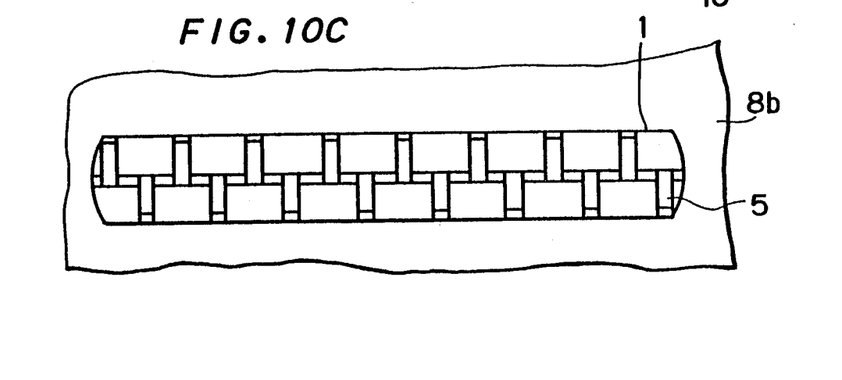

The semiconductor device 1 structured as hereinbefore described may be mounted across two printed circuit boards 8a and 8b as shown in FIG. 10, wherein FIG. 10A is a front view, FIG. 10B is a side view and FIG. 10C is a plane view. In FIG. 10C, the upper printed circuit board 8a is deleted for the purpose of illustrating the semiconductor device 1.

Referring to FIG. 10, the semiconductor device 1 is placed between and perpendicularly to the two parallel printed circuit boards 8a and 8b. A half of the leads 5 projecting from one side of the package which are arranged in an alternate zigzag manner are inserted in through holes 11 of the upper board 8a to be fixed to the board 8a by means of solder 10 supplied in the through holes 11. A remaining half of the leads 5 projecting from the other side of the package which are arranged in an alternate zigzag manner are inserted in through holes 11 of the lower board 8b to be fixed to the board 8b by means of solder 10 supplied in the through holes 11.

Figure 11A:
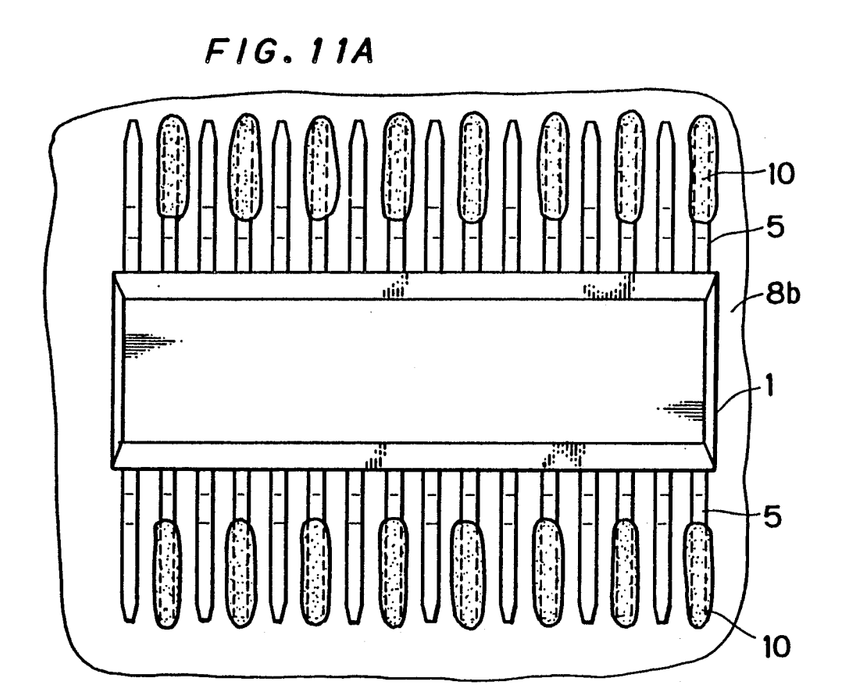
Figure 11B:
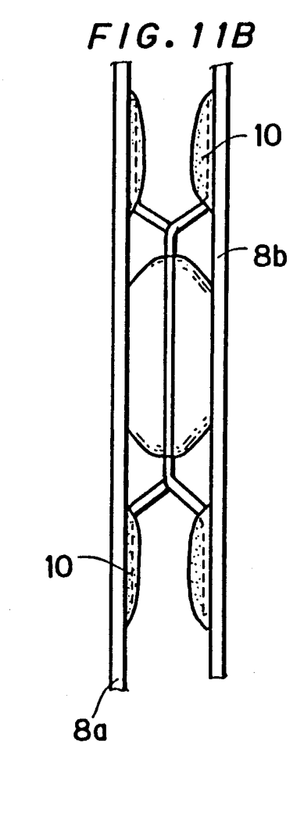
Figure 11C:
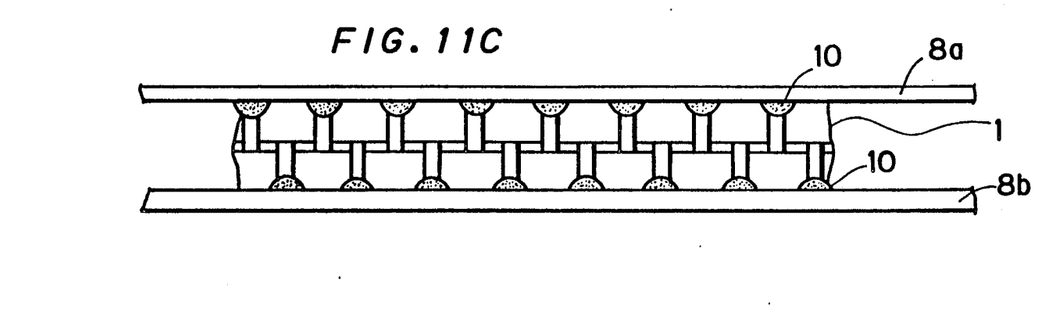

The semiconductor device 1 may also be mounted across two printed circuit boards 8a and 8b as shown in FIG. 11, wherein FIG. 11A is a plane view, FIG. 11B is a side view and FIG. 11C is a front view. In FIG. 11A, the upper printed circuit board 8a is deleted for the purpose of illustrating the semiconductor device 1.

Referring to FIG. 11, the semiconductor device 1 is placed between and parallel to the two parallel printed circuit boards 8a and 8b. A half of the leads 5 lying on one plane in the top surface side of the device 1 are fixed on the upper board 8a by means of solder 10. A remaining half of the leads 5 laying on the other plane in the rear surface side of the device 1 are fixed on the lower board 8b by means of solder 10.

Thus, the semiconductor device 1 can be mounted across the two parallel printed circuit boards 8a and 8b which are perpendicular to or parallel to the leads 5 of the semiconductor device 1.

Figure 12:
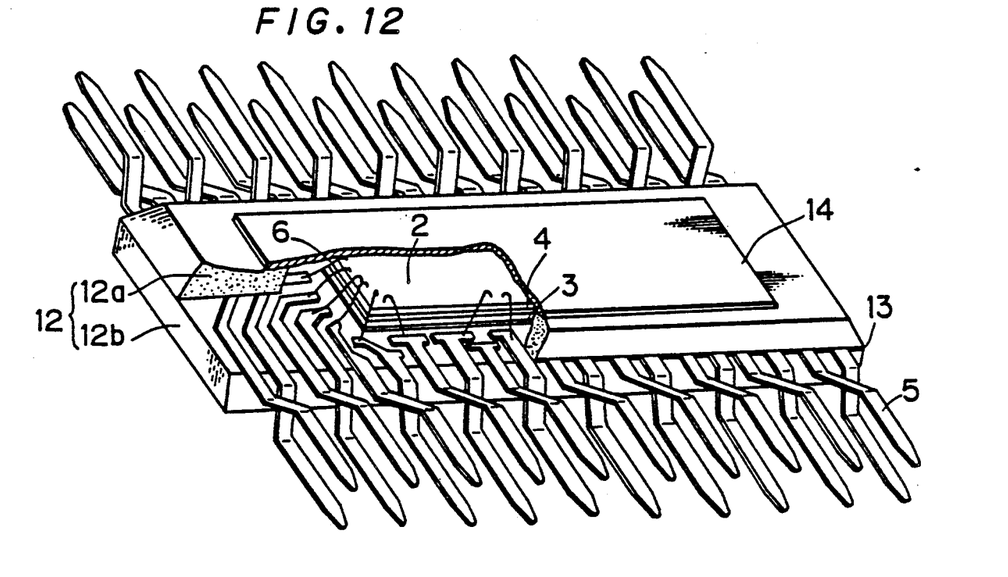
FIG. 12 is a partially cutaway perspective view showing a second embodiment of the semiconductor device in accordance with the present invention.

The plastic package 7 may be replaced by a ceramic package. FIG. 12 is a partially cutaway perspective view showing another embodiment of the semiconductor device in accordance with the present invention, wherein a ceramic package 12 is employed. The ceramic package 12 is composed of two parts of an upper part 12a and a lower part 12b. Leads 5 extend outside through between the upper and lower parts 12a and 12b of the ceramic package 12. Leads 5 and the upper and lower parts 12a and 12b of the ceramic package 12 are attached by means of sealant 13. A metal cover 14 is provided on the upper part 12a of the ceramic package 12 to close a cavity provided in the ceramic package 12. Other structures are the same as those of the semiconductor device shown in FIG. 7.

Figure 13:
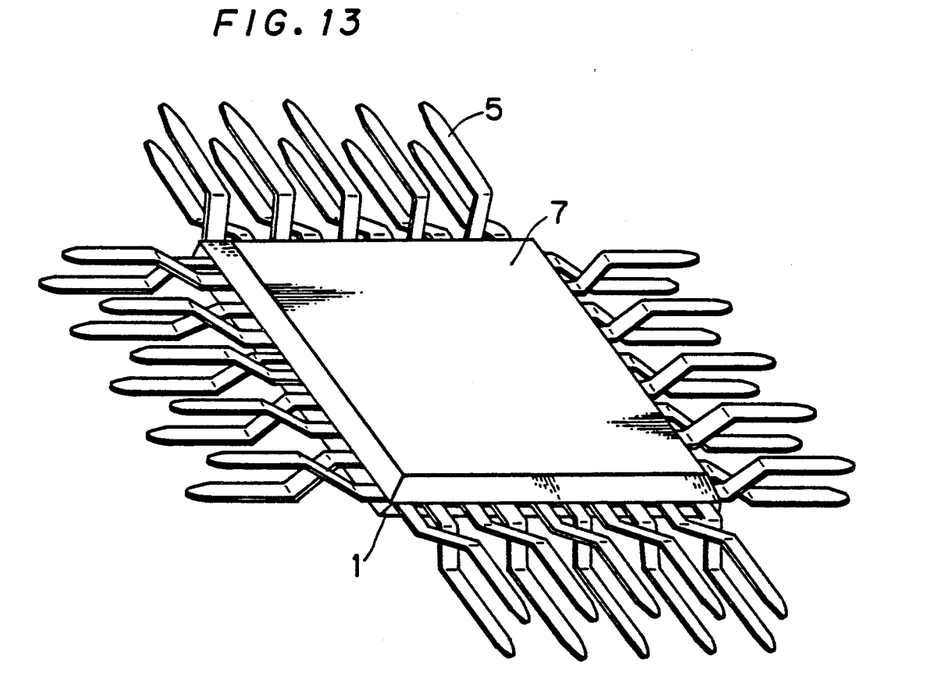
FIG. 13 is perspective view showing a third embodiment of the semiconductor device in accordance with the present invention.

FIG. 13 is a perspective view showing a third embodiment of the semiconductor device in accordance with the present invention, wherein leads 5 are projected from four sides of a package 7 as compared with that in which the leads 5 are provided only at two sides (opposite sides) of the package 7, as shown in the first and second embodiments. Other structures are the same as those of the semiconductor device shown in FIG. 7.

Figure 14A:
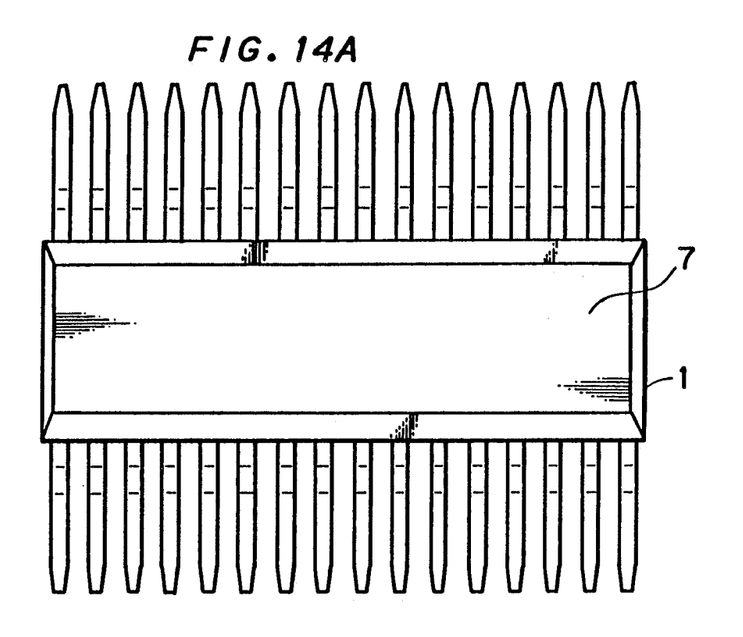
FIG. 14A to FIG. 14C are plane, side and front views, respectively, showing a fourth embodiment of the semiconductor device in accordance with the present invention.
Figure 14B:
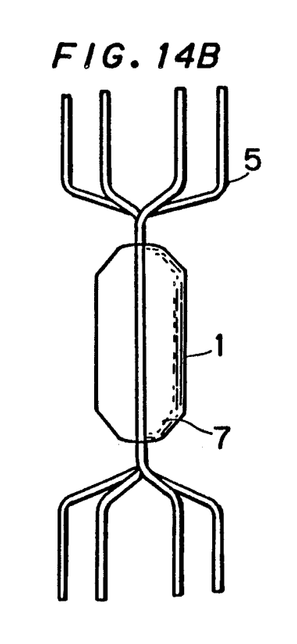
Figure 14C:
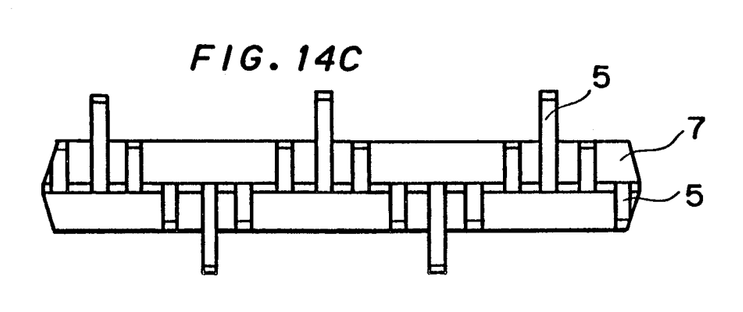

FIG. 14A to FIG. 14C are plane, side and front views, respectively, showing a fourth embodiment of the semiconductor device in accordance with the present invention, wherein leads 5 are bent in a zigzag manner so as to lie on four planes as compared with that in which the leads 5 lie on two planes, as shown in the first to third embodiments. Other structures are the same as those of the semiconductor device shown FIG. 7.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A semiconductor unit, comprising:
   a semiconductor device; and
      first and second printed circuit boards;
         wherein said semiconductor device comprises:

a semiconductor element;
a package for sealing said semiconductor element; and
leads electrically connected to said semiconductor element;
said leads projecting from at least first and second sides of said package and being bent in a zigzag manner so that ends of said leads lie on at least first and second planes; and wherein
said semiconductor device is mounted on said first and second printed circuit boards in a manner that a first group of said leads projecting from said first side of said package are fixed to said first printed circuit board and a second group of said leads projecting from said second side of said package are fixed to said second printed circuit board.

2. A semiconductor unit in accordance with claim 1, wherein
said package has a rectangular configuration, and
said at least first and second sides of said package include opposite sides.

3. A semiconductor unit in accordance with claim 1, wherein
said package has a rectangular configuration, and
said at least first and second sides of said package include four sides.

4. A semiconductor unit in accordance with claim 1, wherein
said first plane includes a plane in a top surface side of said semiconductor device and said second plane includes a plane in a bottom surface side of said semiconductor device.

5. A semiconductor unit in accordance with claim 4, wherein
said at least first and second planes further include a third plane in the top surface side of said semiconductor device and a fourth plane in the bottom surface side of said semiconductor element.

6. A semiconductor unit in accordance with claim 1, wherein
said package includes a plastic package.

7. A semiconductor unit in accordance with claim 1, wherein
said package includes a ceramic package.

8. A semiconductor unit, comprising:
a semiconductor device; and
first and second printed circuit boards;
wherein said semiconductor device comprises:
a semiconductor element;
a package for sealing said semiconductor element; and
leads electrically connected to said semiconductor element;
said leads projecting from at least first and second sides of said package and being bent in a zigzag manner so that ends of said leads lie on at least first and second planes; and wherein
said semiconductor device is mounted on said first and second printed circuit boards in a manner that a first group of said leads lying on said first plane are fixed to said first printed circuit board and a second group of said leads lying on said second plane are fixed to said second printed circuit board.

9. A semiconductor unit in accordance with claim 8, wherein
said package has a rectangular configuration, and
said at least first and second sides of said package include opposite sides.

10. A semiconductor unit in accordance with claim 8, wherein
said package has a rectangular configuration, and
said at least first and second sides of said package include four sides.

11. A semiconductor unit in accordance with claim 8, wherein
said first plane includes a plane in a top surface side of said semiconductor device and said second plane includes a plane in a bottom surface side of said semiconductor device.

12. A semiconductor unit in accordance with claim 11, wherein
said at least first and second planes further include a third plane in the top surface side of said semiconductor device and a fourth plane in the bottom surface side of said semiconductor element.

13. A semiconductor unit in accordance with claim 8, wherein
said package includes a plastic package.

14. A semiconductor unit in accordance with claim 8, wherein
said package includes a ceramic package.

* * * * *